(12) United States Patent
Sed'a et al.

(10) Patent No.: US 9,741,525 B1
(45) Date of Patent: Aug. 22, 2017

(54) CHARGED-PARTICLE MICROSCOPE WITH ASTIGMATISM COMPENSATION AND ENERGY-SELECTION

(71) Applicant: FEI Company, Hillsboro, OR (US)

(72) Inventors: Bohuslav Sed'a, Blansko (CZ); Lubomir Tuma, Brno (CZ); Alexander Henstra, Utrecht (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 15/218,643

(22) Filed: Jul. 25, 2016

(30) Foreign Application Priority Data

Feb. 2, 2016 (EP) ..................................... 16153875

(51) Int. Cl.

| H01J 37/12 | (2006.01) |
|---|---|
| H01J 37/28 | (2006.01) |
| H01J 37/20 | (2006.01) |
| H01J 37/153 | (2006.01) |
| H01J 37/26 | (2006.01) |
| H01J 37/09 | (2006.01) |

(52) U.S. Cl.
CPC ............ *H01J 37/153* (2013.01); *H01J 37/09* (2013.01); *H01J 37/26* (2013.01); *H01J 2237/0451* (2013.01); *H01J 2237/1532* (2013.01); *H01J 2237/2826* (2013.01)

(58) Field of Classification Search
USPC .... 250/281, 282, 306, 307, 309–311, 396 R, 250/370.06, 526
See application file for complete search history.

(56) References Cited

U.S. PATENT DOCUMENTS

| 3,585,383 | A | * | 6/1971 | Castaing | ................. | H01J 37/05 250/251 |
|---|---|---|---|---|---|---|
| 4,524,275 | A | * | 6/1985 | Cottrell | ................... | H01J 49/30 250/298 |
| 5,126,565 | A | * | 6/1992 | Rose | ...................... | H01J 37/05 250/294 |
| 7,034,315 | B2 | | 4/2006 | Henstra et al. | | |
| 8,461,525 | B2 | | 6/2013 | Henstra | | |

(Continued)

OTHER PUBLICATIONS

"Electron Microscope", Wikipedia, Retrieved from the Internet Oct. 15, 2015, http://en.wikipedia.org/wiki/Electron_microscope, 11 pages.

(Continued)

*Primary Examiner* — Bernard Souw
(74) *Attorney, Agent, or Firm* — Scheinberg & Associates, P.C.; Michael O. Scheinberg

(57) ABSTRACT

A method of producing a corrected beam of charged particles for use in a charged-particle microscope, comprising the following steps:
  Providing a non-monoenergetic input beam of charged particles;
  Passing said input beam through an optical module comprising a series arrangement of:
    A stigmator, thereby producing an astigmatism-compensated, energy-dispersed intermediate beam with a particular monoenergetic line focus direction;
    A beam selector, comprising a slit that is rotationally oriented so as to match a direction of the slit to said line focus direction, thereby producing an output beam comprising an energy-discriminated portion of said intermediate beam.

16 Claims, 3 Drawing Sheets

(56) References Cited

U.S. PATENT DOCUMENTS

Figure 1:
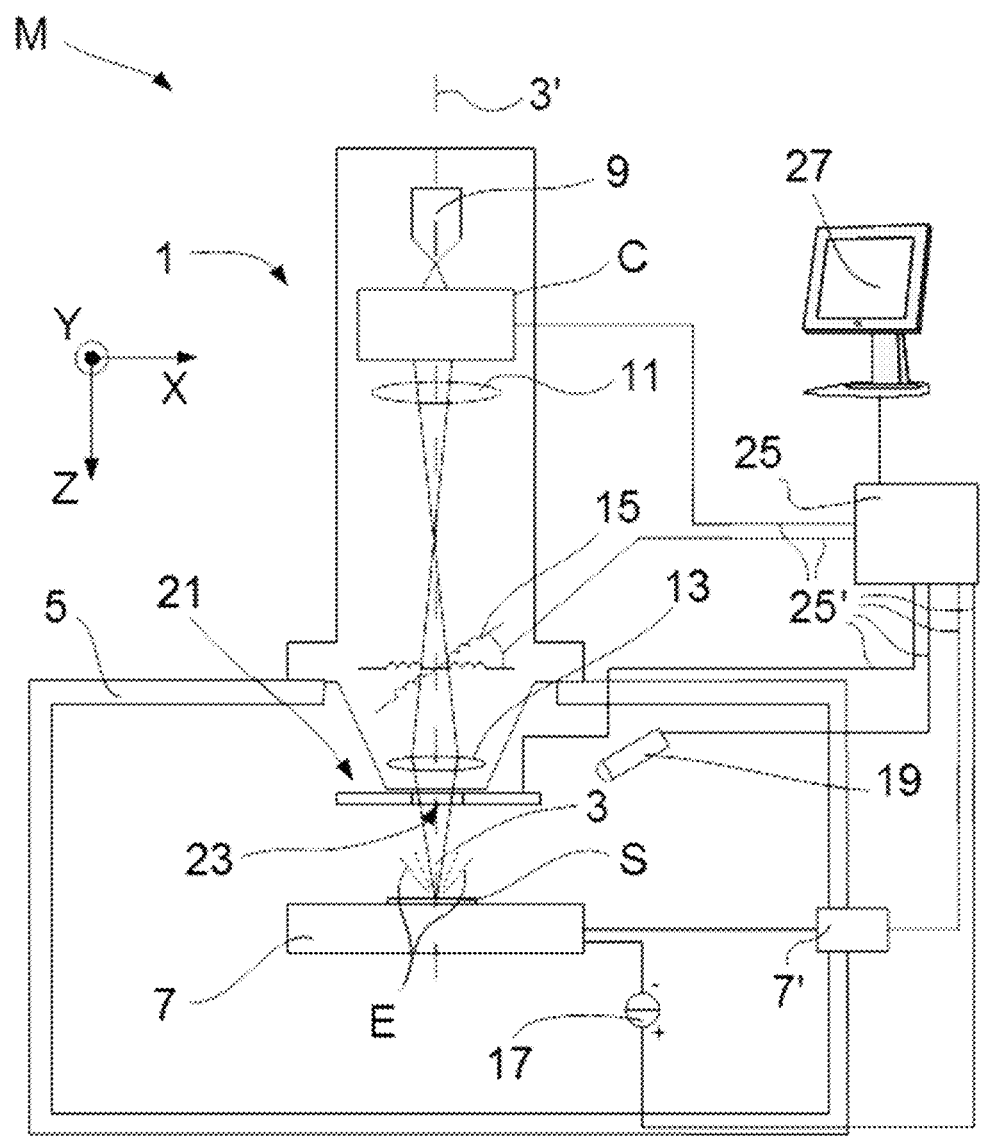

| | | | |
|---|---|---|---|
| 9,362,086 B2* | 6/2016 | Tuma | H01J 37/145 |
| 2004/0144920 A1* | 7/2004 | Lopez | H01J 37/153 |
| | | | 250/305 |
| 2006/0016974 A1* | 1/2006 | Funnemann | H01J 37/05 |
| | | | 250/281 |
| 2007/0069150 A1* | 3/2007 | Frosien | H01J 37/05 |
| | | | 250/396 ML |
| 2008/0290264 A1 | 11/2008 | Henstra et al. | |
| 2009/0289195 A1 | 11/2009 | Henstra | |
| 2011/0284763 A1 | 11/2011 | Henstra | |
| 2012/0112090 A1 | 5/2012 | Henstra | |
| 2012/0273677 A1* | 11/2012 | Tuma | H01J 37/145 |
| | | | 250/307 |
| 2012/0318978 A1* | 12/2012 | Ren | H01J 37/05 |
| | | | 250/310 |
| 2014/0097341 A1* | 4/2014 | Tuma | H01J 37/145 |
| | | | 250/307 |
| 2014/0361165 A1* | 12/2014 | Sed'a | H01J 37/12 |
| | | | 250/307 |
| 2015/0371811 A1 | 12/2015 | Ogawa et al. | |

OTHER PUBLICATIONS

"Focused Ion Beam", Wikipedia, Retrieved from the Internet Jul. 11, 2016, https://en.wikipedia.org/wiki/Focused_ion_beam, 7 pages.

"Scanning Electron Microscope", Wikipedia. Retrieved from the Internet Jul. 25, 2016, http://en.wikipedia.org/wiki/Scanning_electron_microscope, 23 pages.

"Scanning Helium Ion Microscope", Wikipedia, Retrieved from the Internet on Jul. 25, 2016, http://en.wikipedia.org/wiki/Scanning_Helium_Ion_Microscope, 2 pages.

"Scanning Transmission Electron Microscopy", Wikipedia, Retrieved from the Internet Jul. 25, 2016, http://en.wikipedia.org/wiki/Scanning_transmission_electron_microscopy, 5 pages.

"Transmission Electron Microscopy", Wikipedia, Retrieved from the Internet Jul. 25, 2016, http://en.wikipedia.org/wiki/Transmission_electron_microscopy, 23 pages.

Escovitz, W.H. et al., "Scanning Transmission Ion Microscope with a Field Ion Source," Proc. Nat. Acad. Sci. USA, May 1975, pp. 1826-1828, vol. 72, No. 5.

Varentsov, D. et al. "First biological images with high-energy proton microscopy", Physica Medica (2013), pp. 208-213, vol. 29.

* cited by examiner

CHARGED-PARTICLE MICROSCOPE WITH ASTIGMATISM COMPENSATION AND ENERGY-SELECTION

The invention relates to a method of producing a corrected beam of charged particles for use in a charged-particle microscope.

The invention also relates to a corrector device that makes use of such a method.

The invention further relates to a Charged Particle Microscope comprising such a corrector device.

The invention additionally relates to a method of calibrating/adjusting such a corrector device.

Charged particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:

- In a SEM, irradiation of a specimen by a scanning electron beam precipitates emanation of "auxiliary" radiation from the specimen, in the form of secondary electrons, backscattered electrons, X-rays and photoluminescence (infrared, visible and/or ultraviolet photons), for example; one or more components of this emanating radiation is/are then detected and used for image accumulation purposes.
- In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.

More information on some of the topics elucidated here can, for example, be gleaned from the following Wikipedia links:
  http://en.wikipedia.org/wiki/Electron_microscope
  http://en.wikipedia.org/wiki/Scanning_electron_microscope
  http://en.wikipedia.org/wiki/Transmission_electron_microscopy
  http://en.wikipedia.org/wiki/Scanning_transmission_electron_microscopy As an alternative to the use of electrons as irradiating beam, charged particle microscopy can also be performed using other species of charged particle. In this respect, the phrase "charged particle" should be broadly interpreted as encompassing electrons, positive ions (e.g. Ga or He ions), negative ions, protons and positrons, for instance. As regards non-electron-based charged particle microscopy, some further information can, for example, be gleaned from references such as the following:
  https://en.wikipedia.org/wiki/Focused_ion_beam
  http://en.wikipedia.org/wiki/Scanning_Helium_Ion_Microscope
  W. H. Escovitz, T. R. Fox and R. Levi-Setti, *Scanning Transmission Ion Microscope with a Field Ion Source*, Proc. Nat. Acad. Sci. USA 72(5), pp 1826-1828 (1975). http://www.ncbi.nlm.nih.gov/pubmed/22472444

It should be noted that, in addition to imaging and performing (localized) surface modification (e.g. milling, etching, deposition, etc.), a charged particle microscope may also have other functionalities, such as performing spectroscopy, examining diffractograms, etc.

In all cases, a non-transmission Charged Particle Microscope (CPM) will comprise at least the following components:
  A radiation source, such as a Schottky electron source or ion gun.
  An illuminator, which serves to manipulate a "raw" radiation beam from the source and perform upon it certain operations such as focusing, aberration mitigation, cropping (with an aperture), filtering, etc. It will generally comprise one or more (charged-particle) lenses, and may comprise other types of (particle-) optical component also. If desired, the illuminator can be provided with a deflector system that can be invoked to cause its exit beam to perform a scanning motion across the specimen being investigated.
  A specimen holder, on which a specimen under investigation can be held and positioned (e.g. tilted, rotated). If desired, this holder can be moved so as to effect scanning motion of the beam w.r.t. the specimen. In general, such a specimen holder will be connected to a positioning system such as a mechanical stage.
  A detector (for detecting radiation emanating from an irradiated specimen), which may be unitary or compound/distributed in nature, and which can take many different forms, depending on the radiation being detected. Examples include photodiodes, CMOS detectors, CCD detectors, photovoltaic cells, X-ray detectors (such as Silicon Drift Detectors and Si(Li) detectors), etc. In general, a CPM may comprise several different types of detector, selections of which can be invoked in different situations.

In the case of a transmission-type microscope (such as a (S)TEM, for example), the CPM will also comprise:
  An imaging system, which essentially takes charged particles that are transmitted through a sample (plane) and directs (focuses) them onto analysis apparatus, such as a detection/imaging device, spectroscopic apparatus (such as an EELS device), etc. As with the illuminator referred to above, the imaging system may also perform other functions, such as aberration mitigation, cropping, filtering, etc., and it will generally comprise one or more charged-particle lenses and/or other types of particle-optical components.

In what follows, the invention may—by way of example—sometimes be set forth in the specific context of electron microscopy; however, such simplification is intended solely for clarity/illustrative purposes, and should not be interpreted as limiting.

A method as set forth in the opening paragraph above is, for example, known from U.S. Pat. No. 7,034,315 and U.S. Pat. No. 8,461,525 (incorporated herein by reference), which have an inventor in common with the present invention. In said patents, a charged-particle beam is directed eccentrically (off-axis) through a particle-optical lens, as a result of which it becomes (energy-)dispersed, i.e. fanned out into a "spectrum" of different "colors" (particle energies). A diaphragm is then used to select from this spectrum a narrow window in which there is a relatively narrow range Δ of particle energies—thereby converting the dispersed beam into a substantially monoenergetic (confined-energy-spread) sub-beam.

A problem with this known method is that it suffers from detrimental effects of (twofold) astigmatism, particularly associated with the intentionally eccentric passage of the beam through the lens. As a result of such astigmatism, a selected energy range Δ will typically be "polluted" by the presence of charged particles with energies above and/or below Δ.

It is an object of the invention to address this problem. In particular, it is an object of the invention to provide a method/apparatus for generating an improved charged-particle beam for use in a charged-particle microscope. More specifically, it is an object of the invention that such a method/apparatus should provide a means of compensating for (twofold) astigmatism effects. Additionally, it is an object of the invention that said method/apparatus should be able to produce a substantially monoenergetic output beam.

These and other objects are achieved in a method as set forth in the opening paragraph above, characterized by the following steps:
Providing a non-monoenergetic input beam of charged particles;
Passing said input beam through an optical module comprising a series arrangement of:
A stigmator, thereby producing an astigmatism-compensated, energy-dispersed intermediate beam with a particular monoenergetic line focus direction;
A beam selector, comprising a slit that is rotationally oriented so as to match a direction of the slit to said line focus direction, thereby producing an output beam comprising an energy-discriminated portion of said intermediate beam.

The terminology used here will receive further elucidation below.

Astigmatism is traditionally corrected using a pair of co-operating stigmators (e.g. quadrupole optical elements) that are mutually rotated (e.g. through 45°). The present invention produces the surprising insight that, in the current context (production of an acceptable incipient beam for use in a CPM), astigmatism effects can also be satisfactorily compensated using just one stigmator and an associated slit with a selectable rotational stance—which is a great advantage in the cramped confines of a (high-voltage) CPM source/illuminator, since it saves space and reduces the required number of (high-voltage) electrical feedthroughs (which are bulky, and tend to act as undesirable mechanical bridges for environmental vibrations). The invention works as follows:
Astigmatism will cause a point focus to be aberrated into a pair of line foci, which are spaced from one another along an axial direction (beam propagation direction). This effect will occur for each particle energy in the input beam.
In the inventive method, the (suitably configured/excited) stigmator is used to reduce the axial separation of the line foci in the intermediate beam to a (near) minimum (see, for example, Embodiment 3 below).
In a focal plane of a selected one of the line foci (e.g. the proximal line focus, located closest to the stigmator), the direction of the line focus will be unpredictable (see below). To deal with this, the beam selector will have to comprise a rotational degree of freedom, so as to be able to match the slit direction to the particular line focus direction involved.
Dispersion in the intermediate beam will produce a train/series of parallel line foci on the slit plane, each corresponding to a different energy. A particular one of these can be selected by producing appropriate translation of the beam relative to the slit (or vice versa).

Because of this anomalous/non-systematic nature of the line focus orientation in the intermediate beam, passing it through a fixed-direction slit (as in the prior art) will generally not result in selection of a well-defined energy range; however, providing a choice between a variety of slit directions allows selection of an optimum-choice slit orientation that is best matched to a given line focus direction (in that the two are perfectly parallel, approximately parallel, or as parallel as possible in the case of a limited choice of discrete slit orientations—see below). A "nominal" rotational stance of the beam selector can be predetermined based on the chosen rotational stance of the (poles of the) stigmator (about the optical axis).

Another way of (functionally) understanding the invention is to consider the astigmatism of the intermediate beam to be composite in nature, whereby:
The stigmator is used to mitigate a first, systematic astigmatism effect/component;
The beam selector is used to address a second, parasitic astigmatism effect/component.

Somewhat of a loose analogy can be made in this scenario to the situation of a signal that is composed of an "AC" (variable) fluctuation seated upon a "DC" (constant) base: when the DC base is subtracted (analogous to what the stigmator does), the AC component is laid bare.

In a particular aspect of the scenario set forth in the previous paragraph:
Said first, systematic astigmatism effect is associated with eccentric lens traversal by said input beam;
Said second, parasitic astigmatism effect is associated with positioning errors in optical components upstream of the beam selector.

The "lens" traversed here may be the stigmator, or it may be a lens located upstream of the stigmator (similar to the set-up in the aforementioned U.S. Pat. No. 7,034,315/U.S. Pat. No. 8,461,525), or both; it should be remembered in this regard that the stigmator will act as a lens if its differential excitation (multipole effect) is superimposed upon an underlying non-differential excitation (lens effect). The term "upstream" here refers to (portions of) the optical column (including the source) preceding the beam selector. The "positioning errors" referred to here may, for example, include effects such as positional shift/drift, mechanical deformation, form inaccuracy, etc.; a typical example of such an effect is source tip positional shift.

The invention has a number of pronounced advantages relative to the prior art. For example:
It achieves more accurate/defined energy selection than, for example, the technique in aforementioned U.S. Pat. No. 7,034,315/U.S. Pat. No. 8,461,525;
It is capable of delivering a much higher energy-elected output beam current, e.g. increasing a relatively low, typical prior-art value of ca. 25 pA to a much higher value of 200 pA, with an attendant significant improvement in attainable resolution (particularly for beam energies below ~5 keV).
It effectively increases the usable lifetime of upstream components, such as the source. In the past, these had to be discarded once they had become unusable due to (cumulative) drift effects. However, the present invention provides a functionality whereby such drift effects can be (continually) compensated for, allowing prolonged use, with associated cost reduction and uptime improvement.

It mitigates an annoying phenomenon called "banding", in which interference fringes are produced when a beam skims along imperfections (such as burrs) that occur along edges of an energy-selection diaphragm as used in U.S. Pat. No. 7,034,315/U.S. Pat. No. 8,461,525. Because the energy-selection slit of the present invention can be rotationally matched to the orientation of (a monoenergetic line focus of) the astigmatism-compensated intermediate beam emerging from the stigmator, a smaller portion of the slit tends to be illuminated, with an attendant reduction in interference effects.

It reduces cost and complexity, and increases available volume, by removing the need to use a second stigmator for astigmatism compensation.

It should be explicitly noted that the slit of the inventive beam selector does not necessarily have to be located on the optical axis of the stigmator. Instead, if desired, it may be located (slightly) off-axis, so as not to get in the way of an on-axis, uncorrected, high-current beam that may be needed for some applications. This is somewhat analogous to the situation illustrated in U.S. Pat. No. 7,034,315/U.S. Pat. No. 8,461,525, in which the employed diaphragm has an on-axis opening (for a non-eccentric beam) and an off-axis opening (for eccentric beam passage). See, also, FIG. 2 below.

In a particular embodiment of the invention:
Said beam selector comprises an opaque plate containing a plurality of slits of different orientations;
A particular slit is selected by effecting appropriate relative motion of said plate and said intermediate beam.

Figure 2:
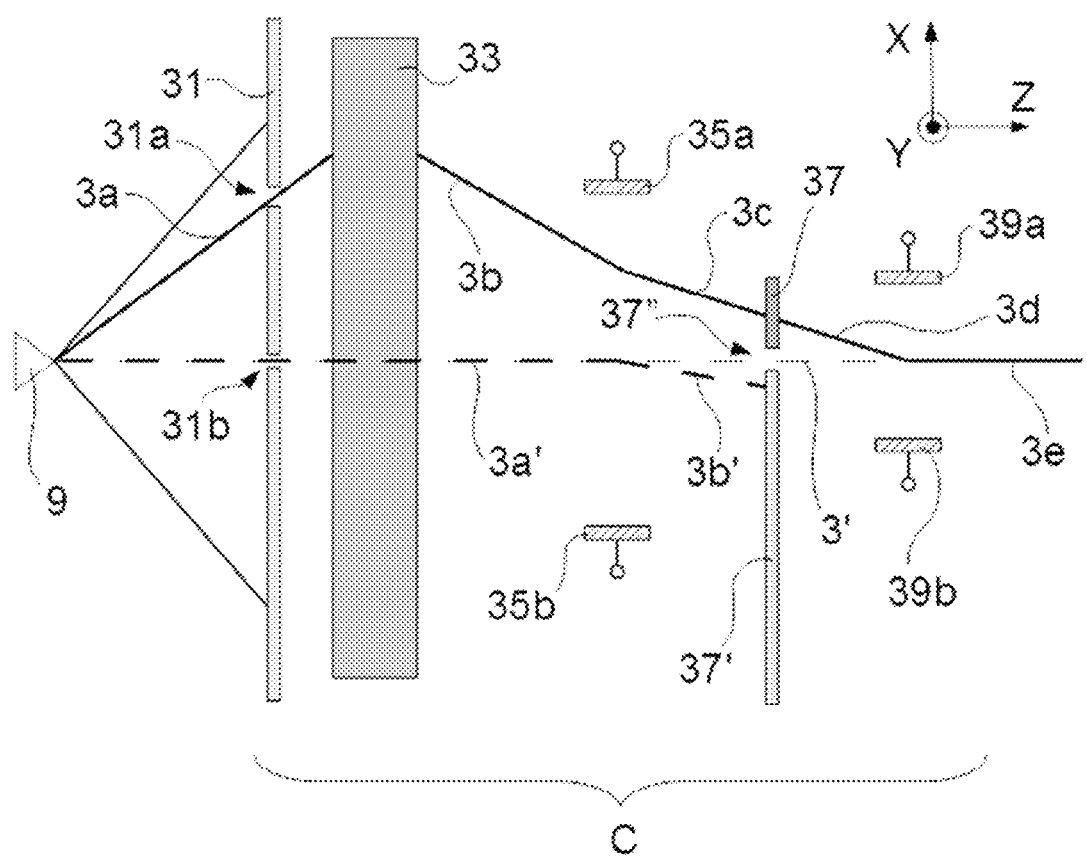
Figure 3:
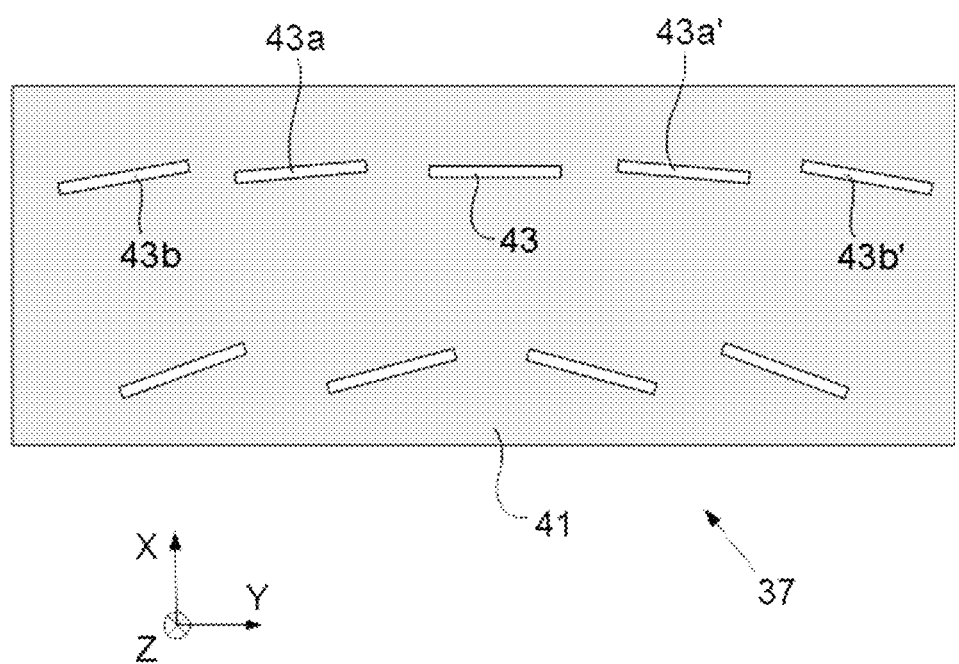

Such a plate offers a discrete collection of slit orientations to the intermediate beam emerging from the stigmator, e.g. a collection of slits that subtend angles of nθ with a reference direction (in the plane of the plate), where n is an integer and θ is an incremental angle (such as 15°, for instance). A plate of this type may be mounted on a slider (or rotating carrousel, for example) that can be used to displace it relative to the stigmator's optical axis (allowing different slits to be placed in the intermediate beam path); alternatively/supplementally, a deflector unit can be used to displace the intermediate beam across the plate (steering the beam onto different slits). An example of an embodiment of this type is illustrated in FIGS. 2 and 3, for example—in which the illustrated plate is arranged perpendicular to the optical axis of the stigmator.

In an alternative embodiment, the beam selector comprises an opaque plate having a slit of adjustable orientation. Such a plate may, for instance, be rotatable about the optical axis of the stigmator (or an off-axis direction parallel thereto), e.g. by mounting it in a ring-shaped bearing chase and rotating it to a given (roll) stance using a mechanism employing a cog/screw drive, for instance. If desired, the slit in such a rotatable plate may also be adjustable in width, e.g. by displacing a movable knife edge back/forth across the slit opening, as desired.

In yet another alternative to the two previous embodiments, a library (e.g. rack/cassette) of different slit plates is stored in situ, and a retriever device (such as a robot arm) is used to fetch a particular plate (from the library) and insert it into the beam selector position, as required; after use, the plate in question can be returned to the library by said retriever arm.

The current invention further relates to a method of calibrating/adjusting the inventive corrector device. One way to do this would be to use a relatively basic procedure such as the following:

Selecting a first slit orientation in said beam selector, and measuring an energy distribution of the output beam emerging from it;
Repeating this procedure for at least one, second slit orientation;
From the set of (at least two) slit orientations thus selected, choosing a member with minimal measured energy distribution.

However, the inventors have developed a more efficient/sophisticated alternative, which comprises the following steps:

Providing an aperture plate containing a test aperture with a cross-section that is substantially smaller than the cross-section of the intermediate beam in the plane of the aperture plate;
Producing relative scanning motion of the test aperture and the intermediate beam cross-section and measuring the beam intensity transmitted through the test aperture as a function of scan position, thereby producing an intensity profile for the beam cross-section;
Using image recognition software to analyze said intensity profile and derive therefrom an associated line focus direction;
Choosing a slit orientation of said beam selector that is most closely matched to said line focus direction.

Such a procedure can be performed at desired intervals, so as to ensure/maintain optimal performance of the corrector device. The scanning motion alluded to may be produced by scanning the intermediate beam across the test aperture and/or by laterally displacing the aperture plate relative to the beam. A test aperture as referred to here might, for example, be a square or round hole with a width of the order of about 100 nm.

The invention will now be elucidated in more detail on the basis of exemplary embodiments and the accompanying schematic drawings, in which:

FIG. 1 renders a longitudinal cross-sectional view of a CPM in which the present invention is implemented.

FIG. 2 renders an illustration of the structure and operating principle of an embodiment of the invention.

FIG. 3 renders an elevational view of a particular embodiment of a beam selector as used in the present invention.

In the Figures, where pertinent, corresponding parts may be indicated using corresponding reference symbols.

EMBODIMENT 1

FIG. 1 is a highly schematic depiction of an embodiment of a CPM in which the present invention is implemented; more specifically, it shows an embodiment of a microscope M, which, in this case, is a SEM (though, in the context of the current invention, it could just as validly be a (S)TEM, or an ion-based microscope, for example). The microscope M comprises an illuminator (particle-optical column) 1, which produces a beam 3 of input charged particles (in this case, an electron beam) that propagates along a particle-optical axis 3'. The illuminator 1 is mounted on a vacuum chamber 5, which comprises a specimen holder 7 and associated stage/actuator 7' for holding/positioning a specimen S. The vacuum chamber 5 is evacuated using vacuum pumps (not depicted). With the aid of voltage supply 17, the specimen holder 7, or at least the specimen S, may, if desired, be biased (floated) to an electrical potential with respect to ground.

The illuminator 1 (in the present case) comprises an electron source 9 (such as a Schottky gun, for example), lenses 11, 13 to focus the electron beam 3 onto the specimen S, and a deflection unit 15 (to perform beam steering/scanning of the beam 3). The apparatus M further comprises a controller/computer processing apparatus 25 for controlling inter alia the deflection unit 15, lenses 11, 13 and detectors 19, 21, and displaying information gathered from the detectors 19, 21 on a display unit 27.

The detectors 19, 21 are chosen from a variety of possible detector types that can be used to examine different types of emergent radiation E emanating from the specimen S in response to irradiation by the input beam 3. In the apparatus depicted here, the following (non-limiting) detector choices have been made:

Detector 19 is a solid state detector (such as a photodiode) that is used to detect photoluminescence emanating from the specimen S. It could alternatively be an X-ray detector, such as Silicon Drift Detector (SDD) or Silicon Lithium (Si(Li)) detector, for example.

Detector 21 is a segmented silicon electron detector, comprising a plurality of independent detection segments (e.g. quadrants) disposed in annular configuration about a central aperture 23 (allowing passage of the primary beam 3). Such a detector can, for example, be used to investigate the angular dependence of a flux of emergent backscattered electrons emanating from the specimen S. It will typically be biased to a positive potential, so as to attract electrons emitted from the specimen S.

The skilled artisan will understand that many different types of detector can be chosen in a set-up such as that depicted.

By scanning the input beam 3 over the specimen S, emergent radiation—comprising, for example, X-rays, infrared/visible/ultraviolet light, secondary electrons (SEs) and/or backscattered electrons (BSEs)—emanates from the specimen S. Since such emergent radiation is position-sensitive (due to said scanning motion), the information obtained from the detectors 19, 21 will also be position-dependent. This fact allows (for instance) the signal from detector 21 to be used to produce a BSE image of (part of) the specimen S, which image is basically a map of said signal as a function of scan-path position on the specimen S.

The signals from the detectors 19, 21 pass along control lines (buses) 25', are processed by the controller 25, and displayed on display unit 27. Such processing may include operations such as combining, integrating, subtracting, false colouring, edge enhancing, and other processing known to the skilled artisan. In addition, automated recognition processes (e.g. as used for particle analysis) may be included in such processing.

It should be noted that many refinements and alternatives of such a set-up will be known to the skilled artisan, including, but not limited to:

The use of dual beams—for example an electron beam 3 for imaging and an ion beam for machining (or, in some cases, imaging) the specimen S;

The use of a controlled environment at the specimen S—for example, maintaining a pressure of several mbar (as used in a so-called Environmental SEM) or by admitting gases, such as etching or precursor gases, etc.

In the specific context of the current invention, the illuminator 1 comprises a corrector device C comprising a series arrangement of a stigmator and a beam selector, as set forth above and as illustrated in more detail in FIGS. 2 and 3 below. This device C serves to perform astigmatism compensation and energy selection, thus producing an output beam 3 that is of superior quality—e.g. as regards (higher) beam current and (reduced) banding errors—and that allows mechanical misalignments upstream of item C, e.g. in the source 9, to be compensated for. See Embodiment 2 below.

EMBODIMENT 2

FIG. 2 schematically illustrates the structure and operation of an embodiment of a method/corrector device according to the present invention (refer also to FIG. 1). In FIG. 2, a source 9 emits charged particles (e.g. electrons) in a multitude of directions, here depicted by a cone emanating from a tip of source 9. A spatial filter 31 (extractor aperture plate) contains an off-axis aperture 31a and an on-axis aperture 31b, considered relative to optical axis 3'. An input beam 3a propagating from source 9 through aperture 31a passes eccentrically through stigmator (quadrupole lens) 33 (centered on axis 3'), and emerges from stigmator 33 as intermediate beam 3b; on the other hand, an (axial) beam 3a' passes non-eccentrically through the center of stigmator 33. As already set forth above, intermediate beam 3b will demonstrate (twofold) astigmatism and energy dispersion.

Downstream of stigmator 33 is a set of deflectors 35a, 35b, which can be used to change the direction of beams 3b, 3a' emerging from stigmator 33. More specifically, as a result of appropriate electrical excitations applied to deflectors 35a, 35b:

Intermediate beam 3b can have its course changed, becoming movable beam segment 3c that can be steered onto different regions of beam selector 37, which is located in a focal plane (slit plane) of one of the line foci of beam 3b/3c. More details regarding beam selector 37 will be given below.

Axial beam 3a' can be diverted off course when it is not needed downstream, so as to impinge on screen (beam block) 37'.

Intermediate beam 3b/3c emerges from beam selector 37 as output beam 3d—which, as set forth above, is less polyenergetic (more energy-discriminated) than intermediate beam 3b/3c. It then passes through deflector pair 39a, 39b, which can be used to deflect it "on-axis", so that it propagates along/substantially parallel to optical axis 3'.

To give a specific, non-binding example, the following approximate axial separations (along axis 3') may be employed:

Source 9 to spatial filter 31: 2.6 mm.
Source 9 to (median plane of) stigmator 33: 5.5 mm.
Source 9 to beam selector 37 (slit plane): 12.5 mm.

Turning now to FIG. 3, this shows the beam selector 37 in more detail, viewed in a direction parallel to axis 3' (Z axis). The particular embodiment shown here comprises a plate 41 in which a plurality of slit-like (elongate) openings have been provided. A particular (central) one (43) of these slits is oriented along axis Y, but others are canted by varying amounts clockwise and anticlockwise relative to this reference: for example, slits 43a, 43a' are respectively canted through +5° and −5° relative to Y, slits 43b, 43b' are respectively canted through +10° and −10° relative to Y, etc. By using the deflector pair 35a, 35b (FIG. 2) and/or by suitably displacing the plate 41 within the XY plane, the cross-section of beam 3c (FIG. 2)—which will have a particular (monoenergetic) line focus direction after emergence from stigmator 33—can be matched (aligned) with a "best fit" from the slits in plate 41; as a result, only a laterally-confined (and directionally matched) portion of the beam cross-section will be allowed to traverse the beam selector 37. As a non-limiting example, the depicted slits in plate 41 each have a length of ca. 2 µm and a width of ca. 0.15 µm, for instance.

EMBODIMENT 3

What follows is an example of a straightforward stigmator adjustment (calibration) routine that can be used in the present invention:
(i) For a first one of the line foci (e.g. the distal line focus, furthest from the stigmator), one selects a particular differential excitation ($E_D$) of the stigmator and adjusts the non-differential excitation ($E_C$) of the stigmator to achieve best focus at the slit plane. One then repeats this procedure for at least one other value of $E_D$, allowing a first plot to be made of $E_C$ versus $E_D$.
(ii) The procedure in (i) is repeated for the second one of the line foci (the proximal line focus, nearest to the stigmator), resulting in a second plot of $E_C$ versus $E_D$.
(iii) The value of $E_D$ at the point of intersection of said first and second plots is the value that will minimize the axial separation of the first and second line foci.

Such a procedure is well within the ambit of the skilled artisan, who can, for example, abbreviate it so that he can obtain the required information from just three data points in total (two for one line focus, and one for the other line focus).

The invention claimed is:

1. A method of producing a corrected beam of charged particles for use in a charged-particle microscope, comprising:
providing a non-monoenergetic input beam of charged particles; and
passing said input beam through an optical module comprising a series arrangement of:
a stigmator, thereby producing an astigmatism-compensated, energy-dispersed intermediate beam with a particular monoenergetic line focus direction; and
a beam selector, comprising a slit that is rotationally oriented so as to match a direction of the slit to said line focus direction, thereby producing an output beam comprising an energy-discriminated portion of said intermediate beam.

2. A method according to claim 1, wherein:
stigmator is used to mitigate a first, systematic astigmatism effect; and
beam selector is used to address a second, parasitic astigmatism effect.

3. A method according to claim 2, wherein;
said first, systematic astigmatism effect is associated with eccentric lens traversal by said input beam; and
second, parasitic astigmatism effect is associated with positioning errors in optical components upstream of the beam selector.

4. A method according to claim 1, wherein:
beam selector comprises an opaque plate containing a plurality of slits of different orientations; and
particular slit is selected by effecting appropriate relative motion of said plate and said intermediate beam.

5. A method according to claim 1, wherein said beam selector comprises an opaque plate having a slit of adjustable orientation.

6. A corrector device for use in a charged-particle microscope, characterized in that it comprises:
input for a non-monoenergetic input beam of charged particles; and
optical module comprising a series arrangement of:
stigmator, for producing an astigmatism-compensated, energy-dispersed intermediate beam with a particular monoenergetic line focus direction; and
beam selector, comprising a slit that can be rotationally oriented so as to match a direction of the slit to said line focus direction, thereby to produce an output beam comprising an energy-discriminated portion of said intermediate beam.

7. A method of calibrating a corrector device as claimed in claim 6, comprising the following steps:
providing an aperture plate containing a test aperture with a cross-section that is substantially smaller than the cross-section of the intermediate beam in the plane of the aperture plate;
producing relative scanning motion of the test aperture and the intermediate beam cross-section and measuring the beam intensity transmitted through the test aperture as a function of scan position, thereby producing an intensity profile for the beam cross-section;
using image recognition software to analyze said intensity profile and derive therefrom an associated line focus direction; and
choosing a slit orientation of said beam selector that is most closely matched to said line focus direction.

8. A Charged Particle Microscope, comprising:
a specimen holder, for holding a specimen;
a source, for producing an irradiating beam of charged particles;
an illuminator, for directing said beam so as to irradiate the specimen; and
a detector, for detecting a flux of radiation emanating from the specimen in response to said irradiation,
wherein the illuminator comprises a corrector device as claimed in claim 6.

9. A method according to claim 2, wherein:
said beam selector comprises an opaque plate containing a plurality of slits of different orientations; and
a particular slit is selected by effecting appropriate relative motion of said plate and said intermediate beam.

10. A method according to claim 3, wherein:
said beam selector comprises an opaque plate containing a plurality of slits of different orientations; and
a particular slit is selected by effecting appropriate relative motion of said plate and said intermediate beam.

11. A method according to claim 2, wherein said beam selector comprises an opaque plate having a slit of adjustable orientation.

12. A method according to claim 3, wherein said beam selector comprises an opaque plate having a slit of adjustable orientation.

13. A method according to claim 10, wherein said beam selector comprises an opaque plate having a slit of adjustable orientation.

14. A method of producing a corrected beam of charged particles for use in a charged-particle microscope, comprising:
providing a non-monoenergetic beam of charged particles;
compensating for astigmatism in the beam of charged particles;
dispersing the charged particles in the beam to focus monoenergetic charged particles in a line; and filtering the dispersed beam to produce an energy-discriminated output beam of the charged particles focused in the line.

15. A method according to claim 14, in filtering the dispersed beam to produce an energy-discriminated output beam of the charged particles focused in the line comprises passing the beam through a slit rotationally oriented so as to match a direction of said line focus direction.

16. A method according to claim 14, in which:
compensating for astigmatism comprises mitigating a first, systematic astigmatism effect; and
filtering the dispersed beam to produce an energy-discriminated output beam addresses a second, parasitic astigmatism.

\* \* \* \* \*